US007508221B2

(12) United States Patent
Wuersch et al.

(10) Patent No.: US 7,508,221 B2
(45) Date of Patent: Mar. 24, 2009

(54) WALL DETECTOR

(75) Inventors: Christoph Wuersch, Werdenberg (CH);
Wilfried Kaneider, Feldkirch-Tosters
(AT); Harald Schmitzer, Werdenberg
(CH)

(73) Assignee: Hilti Aktiengesellschaft, Schaan (LI)

( * ) Notice: Subject to any disclaimer, the term of this patent is extended or adjusted under 35 U.S.C. 154(b) by 0 days.

(21) Appl. No.: 11/502,177

(22) Filed: Aug. 8, 2006

(65) Prior Publication Data
US 2007/0035313 A1 Feb. 15, 2007

(30) Foreign Application Priority Data
Aug. 9, 2005 (DE) .................. 10 2005 037 632

(51) Int. Cl.
*G01R 27/26* (2006.01)
(52) U.S. Cl. .................. 324/663; 324/687; 324/686; 324/658
(58) Field of Classification Search .................. 324/663, 324/686, 687, 658
See application file for complete search history.

(56) References Cited

U.S. PATENT DOCUMENTS

| 4,099,118 | A | * | 7/1978 | Franklin et al. ............. 324/671 |
| 4,859,931 | A | * | 8/1989 | Yamashita et al. ............ 324/67 |
| 5,485,092 | A | * | 1/1996 | Fortin ........................ 324/457 |
| 5,654,643 | A | * | 8/1997 | Bechtel et al. ............... 324/687 |
| 6,211,662 | B1 | * | 4/2001 | Bijawat et al. ................ 324/67 |
| 6,630,833 | B2 | * | 10/2003 | Scott ........................... 324/637 |
| 6,842,018 | B2 | * | 1/2005 | McIntosh ..................... 324/664 |
| 6,894,508 | B2 | * | 5/2005 | Sanoner et al. ............. 324/662 |
| 7,106,072 | B2 | * | 9/2006 | Clauss et al. ................ 324/662 |
| 2007/0046289 | A1 | * | 3/2007 | Troxler ........................ 324/334 |

FOREIGN PATENT DOCUMENTS

| DE | 19847688 A1 | 5/2000 |
| DE | 19915016 A1 | 5/2000 |
| WO | WO 03/073132 A1 * | 9/2003 |

OTHER PUBLICATIONS

Fink et al. Standard Handbook for Electrical Engineers, McGraw-Hill, Tenth Edition, 1968, p. 4-124 to 4-126.*

* cited by examiner

*Primary Examiner*—Timothy J. Dole
*Assistant Examiner*—Thomas F. Valone
(74) *Attorney, Agent, or Firm*—Abelman, Frayne & Schwab

(57) ABSTRACT

A wall detector (1) for detecting an object (3) embedded in a substrate (2) includes a detection antenna (5) for introducing broadband, high-frequency alternating electric fields (9) of a measurement frequency ($f_M$) in the substrate (2); a measurement system (6) connected to the detection antenna (5) for measuring the delayed interaction of the alternating fields (9) with the object (3), a calculation device (7) for detecting the object (3) based on the measurement signal and for determining the associated depth information, and a permittivity measurement device (8) with at least one auxiliary potential plate (11) for measuring the permittivity measurement signal of the substrate at a permittivity measurement frequency ($f_p$) that is a lower than the measurement frequency; and an associated measurement method.

13 Claims, 3 Drawing Sheets

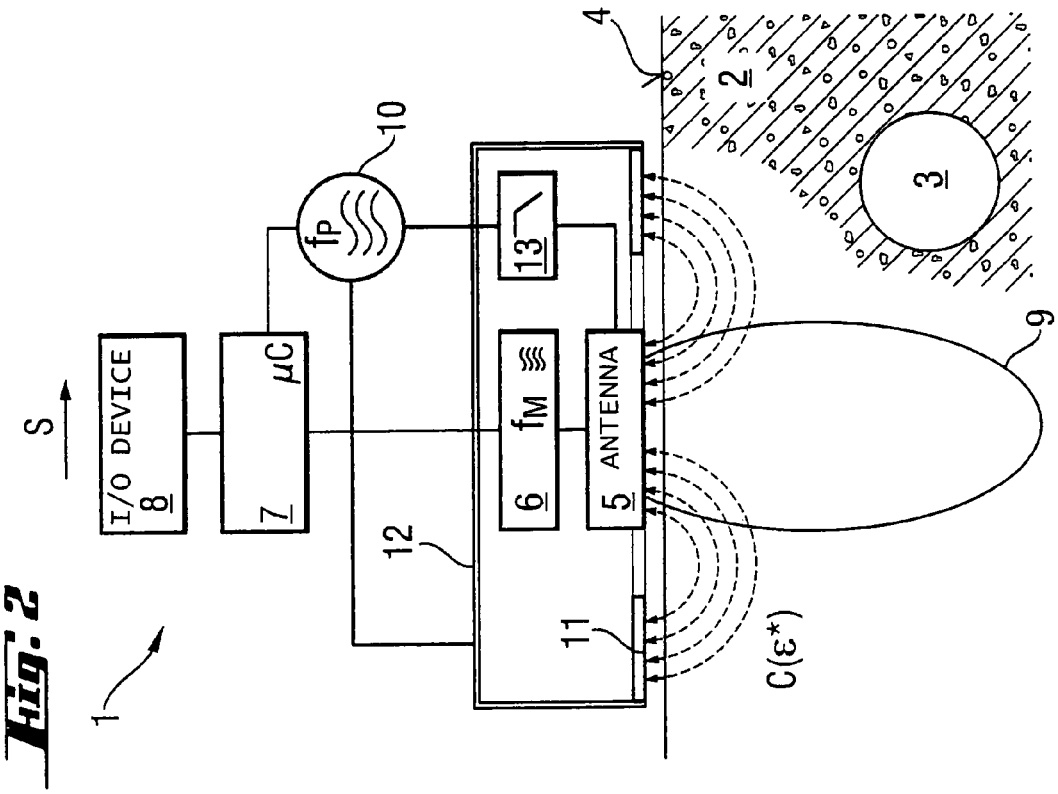
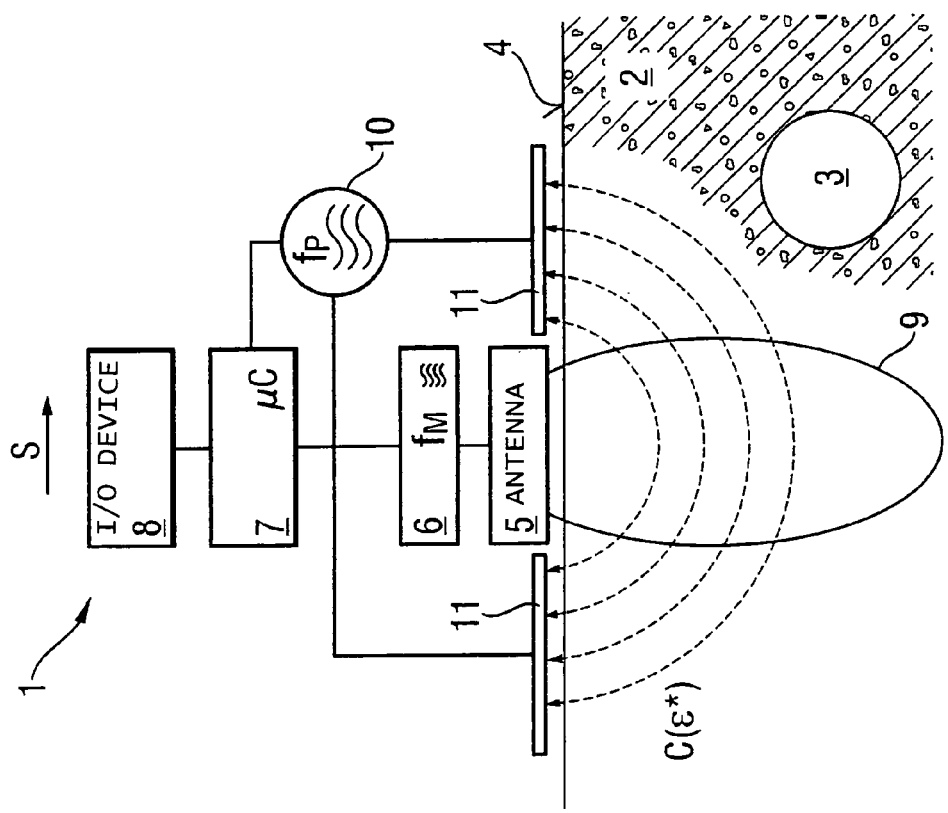

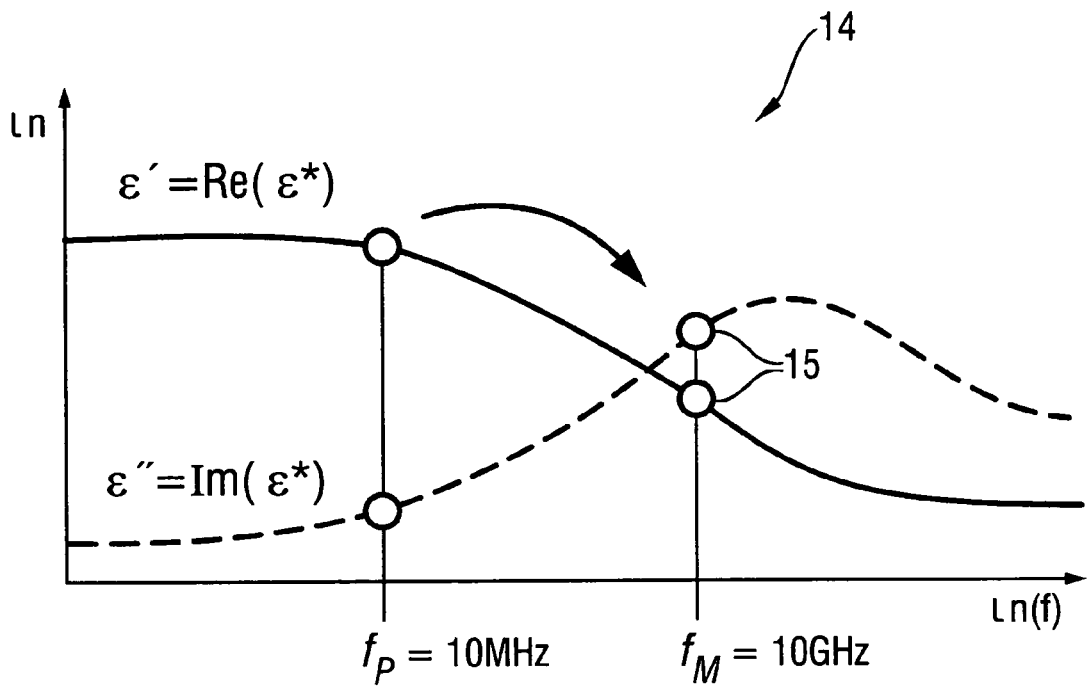

Fig. 3

$$\varepsilon^*(\omega) = \varepsilon_\infty + \frac{\varepsilon_S - \varepsilon_\infty}{1 + i\omega\tau} \qquad \varepsilon' = \varepsilon_\infty + \frac{\varepsilon_S - \varepsilon_\infty}{1 + \omega^2\tau^2}$$

$$\varepsilon'' = \varepsilon_\infty + \frac{\omega\tau(\varepsilon_S - \varepsilon_\infty)}{1 + \omega^2\tau^2} \qquad \varepsilon^* \simeq \varepsilon_r - j \cdot \left(\frac{\sigma}{\omega}\right) = \varepsilon' + j\varepsilon''$$

$\varepsilon_\infty = 23.46$
$\varepsilon_S = 81.84$
$\tau = 9.4\,ps$
$\omega = 2\pi f$

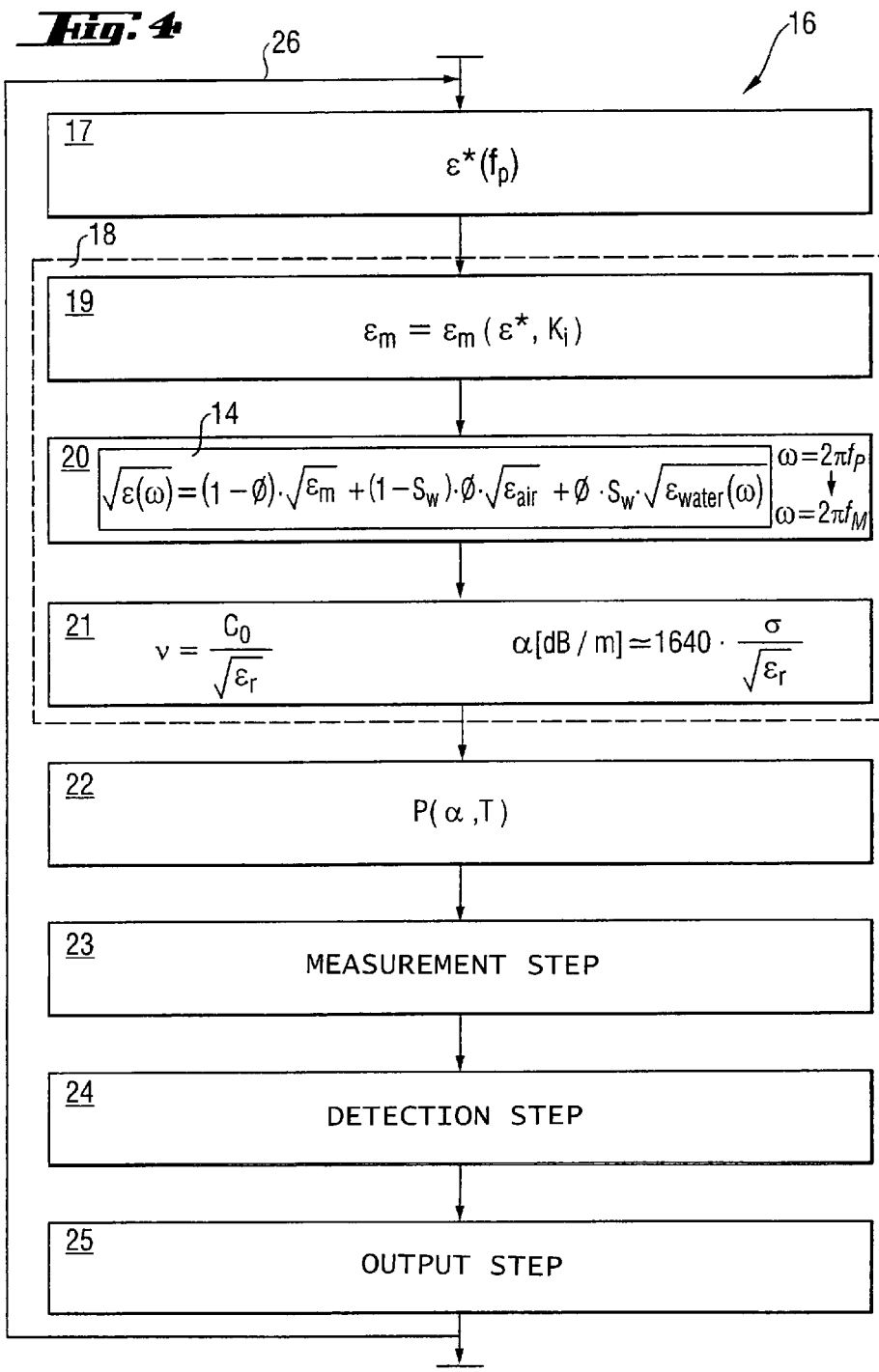

WALL DETECTOR

BACKGROUND OF THE INVENTION

1. Field of the Invention

The present invention is directed to a wall detector and an associated measurement method for detecting objects such as iron reinforcements and plastic conduit which are enclosed in walls.

In the constructional industry, devices based on a radar technology (e.g., DE19847688) or capacitive UWB (ultra-wideband) technology (e.g., EP1478949) are used for locating objects in substrates, e.g., iron reinforcements or plastic conduit in walls (side walls, ceilings, floors). For this purpose, high-frequency alternating electric fields are introduced by a detection antenna into the substrate to be examined. The interaction of these high-frequency alternating electric fields with the objects is fed back with a delay to the detection antenna. There are devices of the kind mentioned above with measurement systems operating in the frequency domain and those that operate instead in the time domain. These known measurement systems for detection are not in themselves the object of the invention but form a necessary part of it.

2. Description of the Prior Art

Common for all of these measurement systems, is the use of a large frequency bandwidth. This bandwidth is necessary for achieving a sufficient depth resolution. Measurement frequencies in the band range of 0.1 GHz to 10 GHz are suitable for finding locations of objects in the constructional industry. This large band region is selected because, depending upon the application, a sufficient lateral resolution, a sufficient depth resolution, and a sufficient penetration (measurement depth) can be achieved in this way. Therefore, the choice of the center frequency of the frequency band is a compromise between resolution and measurement depth. The higher the frequency, the higher the resolution, but the higher also the attenuation and the lower the measurement depth that can be achieved.

The propagation velocity $\upsilon$ of the electromagnetic interaction in media is reduced relative to that of the speed of light in vacuum $c_0$ by the divisor $\sqrt{\in_r}$, where $\in_r$ is the relative permittivity of the medium. Therefore, in order to correctly measure the depth of objects in substrates by the time behavior or frequency behavior of the electromagnetic interaction, the relative permittivity of the substrate must be known. Even when the substrate (e.g., concrete) is always the same, the permittivity can change drastically as a function of the natural humidity. Dry concrete has a relative permittivity of roughly $\in_{concrete}=5$, whereas water has a static relative permittivity of $\in_{water}=80$. Because of the high porosity of concrete (and of most building materials such as brick, lightweight concrete, etc.) of about 14% by volume, concrete can also absorb much water. Humidity is therefore the dominant influencing factor for determining the relative permittivity $\in_r$ of the substrate.

EP1478949 discloses a wall detector for detecting an object embedded in a substrate which has a detection antenna for introducing high-frequency alternating electric fields in the substrate, a measurement system connected to the detection antenna for measuring the delayed interaction of the alternating fields with the object, and a calculation device for detecting the object from the measurement signal and for determining the associated depth information. Separation of object signal components and substrate signal components is effected in a method step, with the relative permittivity of the medium being determined by correlation with reference values and begin used, together with the phase information of the object signal component, to determine the depth of the object.

Another factor influencing electromagnetic interaction is the salt content of the substrate. The salts are usually dissolved in interstitial water which leads to conductivity $\sigma$ and, therefore, resistive losses, so that the absorption $\alpha$ by the substrate of the introduced electromagnetic interaction depends upon the penetration depth. The higher the absorption $\alpha$ by the substrate, the more power must be introduced into the substrate for a required signal-noise ratio to achieve the necessary dynamic for detecting the deep-lying objects.

According to DE19915016, a radar wall detector evaluates, in addition to the measurement signal, a high-frequency crosstalk signal proceeding from a transmission antenna and acting on a reception antenna at a distance laterally therefrom, for determining the absorption and permittivity of the substrate and regulates the output of the wall detector depending on the determined absorption.

SUMMARY OF THE INVENTION

An object of the invention are a wall detector and an associated method with accurate depth information.

This and other objects of the present invention, which will become apparent hereinafter are achieved by providing a wall detector for detecting an object embedded in a substrate and including a detection antenna for introducing broadband, high-frequency alternating electric fields of a measurement frequency in the substrate, a measurement system connected to the detection antenna for measuring the delayed interaction of the alternating fields with the object, a calculation device for detecting the object from the measurement signal and determining the associated depth information and a permittivity measurement device with at least one auxiliary potential plate for measuring a permittivity measurement signal of the substrate at a permittivity measurement frequency that is a lower than the measurement frequency.

An associated measurement method for detecting an object embedded in a substrate includes a measurement step that is carried out by the measurement system for measuring the delayed interaction between the object and the broadband, high-frequency alternating electric fields of a measurement frequency which are introduced in the substrate by a detection antenna, a detection step that is carried out by calculation device for detecting the object from the measurement signal and for determining the associated depth information, a permittivity measurement step in which a permittivity measurement signal is measured and which is carried out by the permittivity measurement device beforehand with a permittivity measurement frequency that is lower than the measurement frequency, and a permittivity determination step in which the permittivity of the substrate is determined for the measurement frequency by the calculation device by using a stored material model.

By providing a permittivity measurement device with at least one auxiliary potential plate which determines the permittivity of the substrate by means of an additional permittivity measurement frequency that is lower than the measurement frequency, the influence of embedded objects on the determination of permittivity is extensively suppressed already at the start of the measurement. This is because the lower-frequency permittivity measurement frequency has a substantially higher penetration of the substrate and substantially smaller interactions with embedded objects. Accordingly, the permittivity of the substrate for the measurement frequency determined indirectly in this way by an accurate material model can be used to accurately determine information about the depth of embedded objects as well.

In order to put this into context within the theoretical background, some fundamental principles of physics will be discussed briefly below. The relative permittivity $\in_r$, also called relative dielectric constant, is the dielectric susceptibility of the dielectric polarization multiplied by one and, as such, is a pure material characteristic in the continuum model, but is dependent on time and frequency because its causality is based on the dynamic of microphysical "bodies" (in this instance, charge centroids). Generally, such susceptibilities can be described well by relaxors—the generalized solutions of highly-attenuated motion equations. A known solution which is also particularly suitable for water is the Debye relaxor which describes an independent, ideal relaxor in the homogeneous electric field. According to this solution, the relative permittivity $\in r$ can be represented by the real part and the conductivity by the imaginary part of a complex variable, complex permittivity $\in^*$, which is time-dependent and frequency-dependent over many decades, which, as such, can be measured experimentally, e.g., by amplitude and phase or by their transformed quantities. Accordingly, within the scope of validity of the Debye model, using known model parameters, permittivity values determined at a low permittivity measurement frequency can be used to extrapolate permittivity values with substantially higher (two to three decades) measurement frequencies. This is also true in a corresponding manner for the special CRI (Complex Refraction Index) model which is based on this and which, in addition, describes the mixing of porous building material and water.

The permittivity measurement frequency is advantageously lower than the mean measurement frequency by at least two decades, preferably by at least three decades, so that the permittivity measurement is carried out with less influence of embedded objects and high penetration of the substrate.

The at least one auxiliary potential plate is advantageously arranged symmetrically (mirror-symmetrically or rotationally symmetrically) to the detection antenna so that the mean location of the permittivity measurement is the same as the detection measurement location.

In an advantageous manner, exactly one auxiliary potential plate connected with the permittivity measurement device is provided. With the detection antenna acting as another potential plate, the auxiliary potential plate forms an open capacitor whose dielectric is formed by the substrate so that the detection antenna can be used multiple times.

The detection antenna is advantageously connected to the permittivity measurement device by a decoupling device (electronic switch or low-pass filter) so that the sensitive permittivity measurement device is reliably insulated from high-energy, high-frequency measurement signals.

The permittivity measurement device is advantageously formed as an oscillator within the oscillating circuit or bridge arm of which the auxiliary potential plates, with the substrate as dielectric, form a measurement capacitance so that the complex relative permittivity can be measured simply by amplitude and phase displacement of the stationary oscillation.

Alternatively, the permittivity measurement device is advantageously formed as a switched charge transfer sensor in which the auxiliary potential plates, with the substrate as dielectric, form the measured measurement capacitance, so that the relative permittivity can be measured without interference and with high accuracy by switched voltage ratios which are accumulated according to the charge transfer principle. The attenuation is determined by the use of different pulse widths.

The material model for the permittivity determination step in the measurement method is advantageously a Debye model or a more specific model (including a measured calibration curve) describing a relaxation so that it is possible to extrapolate the permittivity and the absorption in a highly accurate manner by two or three decades in the frequency domain or time domain.

In an advantageous manner, in an extrapolation step of the permittivity determination step, the water component is determined depending on the (complex) permittivity measured in the permittivity measurement step with a given building material permittivity by using the material model (CRI model or other mixing model) which takes into account a material mixture, and the complex permittivity of the substrate at the measurement frequency is extrapolated subsequently by means of this material model with the water component as fixed parameter.

Proceeding from the latter step, the propagation velocity $\upsilon$ of the electromagnetic interaction in the substrate and the depth-dependent absorption $\alpha$ are advantageously calculated in a calculation step following the extrapolation step, so that the parameters required for a detection step with highly accurate depth determination and optionally regulated output are determined.

In an advantageous manner, in the permittivity determination step, in a preceding classification step, depending on the complex permittivity measured in the permittivity measurement step, a correlation to exactly one of a plurality of building material classes is carried out by means of predetermined classification criteria, and an associated building material permittivity is selected as fixed parameter, so that different building materials are taken into account.

In an advantageous manner, in a subsequent output regulating step of the calculation device, the measurement system preselects the strength of the alternating electric field to be introduced in the substrate at an output value required for a sufficient dynamic depending on an extrapolated absorption $\alpha$ of the substrate at the measurement frequency $f_M$ and the required measurement depth, so that the detection antenna need not introduce more power into the substrate than is needed for the measurement.

The permittivity measurement step and the subsequent permittivity determination step and, optionally, the output regulating step are advantageously repeated multiple times, preferably before every (nth) measurement step, so that changes in the substrate (changing humidity, etc.), which occur during a scanning measurement with the wall detector, are detected and taken into account in a corresponding manner when determining the depth information of detected objects and, optionally, for adjusting the output.

The novel features of the present invention, which are considered as characteristic for the invention, are set forth in the appended claims. The invention itself, however, both as to its construction and its mode of operation, together with additional advantages and objects thereof, will be best understood from the following detailed description of preferred embodiments, when read with reference to the accompanying drawings.

BRIEF DESCRIPTION OF THE DRAWINGS

The drawings show:

FIG. 1 a wire diagram of a wall detector according to the present embodiment;

FIG. 2 a wire diagram of another embodiment of a wall detector according to the present invention;

FIG. 3 a material model; and

FIG. 4 an algorithm of the measuring method.

DETAILED DESCRIPTION OF THE PREFERRED EMBODIMENTS

According to FIG. 1 and FIG. 2, a wall detector 1 for detecting an object 3 embedded in a substrate 2 is moved along a wall 4 so as to scan along a scanning direction S. Its detection antenna 5 introduces broadband, high-frequency alternating fields 9 into the substrate 2 in a directed manner. A broadband, high-frequency measurement system 6 for measuring the delayed interaction of the directed alternating fields 9 of a measurement frequency $f_M$=2 GHz with the object 3 is connected to the detection antenna 5. A calculation device 7 in the form of a microcontroller µC which is connected to the measurement system 5 serves to detect the object 3 from the measurement signal and to determine the associated information about the depth of the object 3 which is displayed on an input/output device 8. A permittivity measurement device 10, likewise connected to the calculation device 7, for measuring the complex permittivity $\in^*$ of the substrate 2 at a permittivity measurement frequency $f_p$=10 MHz that is lower than the measurement frequency $f_M$ has at least one auxiliary potential plate 11 forming a measurement capacitance C which is dependent on the complex permittivity $\in^*$ of the substrate 2.

According to FIG. 1, the permittivity measurement device 10 in the form of an oscillator is connected to two auxiliary potential plates 11 which are arranged on both sides of the detection antenna 5 and between which the measurement capacitance C is formed.

According to the embodiment of FIG. 2, the permittivity measurement device 10 in the form of a charge transfer sensor is connected to exactly one auxiliary potential plate 11 and is connected by a decoupling device 13 in the form of a low-pass filter to the detection antenna 5 acting as additional potential plate, the measurement capacitance C being formed therebetween. The auxiliary potential plate 11 is arranged on the wall side at a cup-shaped shield 12 of the high-frequency detection antenna 5, of the measurement system 6, and of the decoupling device 13 and is formed rotationally symmetric to the detection antenna 5.

According to FIG. 3, a material model 14 which is represented by a double algorithm and is stored in the calculation device describes the complex permittivity $\in^*$ depending on the frequency f which extends over many decades. Its real part $Re(\in')$ is correlated with the relative permittivity $\in_r$ and the imaginary part $Im(\in'')$ is correlated with the conductivity σ. The peak/valley transition of the real part $Re(\in')$ and the associated maximum of the imaginary part $Im(\in'')$ are typical of a relaxor. The formulas and parameters indicated for this follow from the Debye model for water. On the basis of this material model 14, the complex permittivity $\in^*$ measured at the permittivity measurement frequency $f_p$=10 MHz is extrapolated by the calculation device to an extrapolation value 15 at the measurement frequency $f_M$=10 GHz which is higher by three decades.

According to FIG. 4, in the associated measurement method for detecting an object embedded in a substrate, which step is program-controlled by the calculation device with an implemented algorithm 16, the delayed interaction between the object and the broadband, high-frequency alternating electric fields having a measurement frequency $f_M$ which are introduced into the substrate by a detection antenna, is measured in a measurement step 23 carried out by the measurement system. Subsequently, in a detection step 24 carried out by the calculation device, an object is detected from the measurement signal, and the associated depth information is determined by the propagation velocity u of the electromagnetic interaction in the substrate and is displayed in a subsequent output step 25. Since the measurement step 23, the detection step 24, and the output step 25 are conventional, per se, and therefore, do not represent a novel feature of the invention, the person skilled in the art is referred in this regard to the pertinent prior art, preferably the references cited in the description. In a permittivity measurement step 17 preceding the measurement step 23, a permittivity measurement signal is measured by the permittivity measurement device at the permittivity measurement frequency $f_p$ which is lower than the measurement frequency $f_M$. From this measurement, the relative permittivity $\in_r$ and the absorption α of the substrate are extrapolated for measurement frequency $f_M$ in a subsequent permittivity determination step 18 by the calculation device by using the stored material model 14. In the permittivity determination step, a correlation to exactly one of i=1 . . . 5 building material classes is carried out first in a classification step 19, depending on the complex permittivity $\in^*$ measured in the permittivity measurement step, by predetermined disjunctive classification criteria $K_i$, and an associated dry relative building material permittivity $\in_m$ is selected as a fixed parameter. Subsequently, a water component $S_w$ is determined in an extrapolation step 20 using the complex permittivity $\in^*$ measured in the permittivity measurement step 17 for the permittivity measurement frequency $f_p$ by using the material model 14, taking into account a porous material mixture in the form of a CRI model (valid individually for the real part and for the imaginary part) with predetermined dry relative building material permittivity $\in_m$, relative air permittivity $\in_{air}$, a typical porosity Φ, and the relative permittivity of water $\in_{water}$, which is itself modeled complexly on the Debye model (FIG. 3), at the permittivity measurement frequency $f_p$. Subsequently, with this water component $S_w$ as a fixed parameter, the complex permittivity $\in^*$ of the substrate is extrapolated at the measurement frequency $f_M$ by means of this model. Accordingly, in particular, the relative permittivity $\in_r$ of the substrate is determined by the real part, and the conductivity σ of the substrate is determined by means of the imaginary part at measurement frequency $f_M$ (FIG. 3). In a subsequent calculation step 21, the propagation velocity υ of the electromagnetic interaction in the substrate, which, in addition to the speed of light in vacuum $c_0$, is dependent on the relative permittivity $\in_r$, and the depth-dependent absorption α are calculated from the preceding measurement by the calculation device. In a subsequent output regulating step 22, by means of the calculation device, the measurement system, depending on the extrapolated absorption α of the substrate at the measurement frequency $f_M$ and on a predetermined measurement depth T, preselects the strength of the alternating electric field to be introduced into the substrate to an output value P required for a sufficient dynamic. The permittivity measurement step 17, the subsequent permittivity determination step 18, and the output regulating step 22 are repeated in a loop 26 before every measurement step 23.

Though the present invention was shown and described with references to the preferred embodiments, such are merely illustrative of the present invention and are not to be construed as a limitation thereof and various modifications of the present invention will be apparent to those skilled in the art. It is, therefore, not intended that the present invention be limited to the disclosed embodiments or details thereof, and the present invention includes all variations and/or alternative embodiments within the spirit and scope of the present invention as defined by the appended claims.

What is claimed is:

1. Wall detector for detecting an object (3) embedded in a substrate (2), comprising a detection antenna (5) for introducing broadband, high-frequency alternating electric fields (9) of a mean measurement frequency ($f_M$) in the substrate (2); a measurement system (6) connected to the detection antenna (5) for measuring a delayed interaction of the alternating fields (9) with the object (3); a calculation device (7) for detecting the object (3) based on a measurement signal and for determining an associated depth information; and a permittivity measurement device (10) with at least one auxiliary potential plate (11) for measuring a permittivity measurement signal of the substrate at a permittivity measurement frequency ($f_p$) that is lower than the mean measurement frequency ($f_M$), with the permittivity measurement device (10) performing a permittivity determination step (18) in which a relative permittivity $\in_r$ of the substrate (2) is determined for the measurement frequency ($f_M$) by the calculation device (7) using a stored material model (14) described by a relaxation in the permittivity determination step (18).

2. Wall detector according to claim 1, wherein the permittivity measurement frequency ($f_p$) is lower than the mean measurement frequency ($f_M$) by at least two decades.

3. Wall detector according to claim 2, wherein the permittivity measurement frequency ($f_p$) is lower than the mean measurement frequency ($f_M$) by three decades.

4. Wall detector according to claim 1, wherein the at least one auxiliary potential plate (11) is arranged symmetrically with detection antenna (5).

5. Wall detector according to claim 1, wherein the detection antenna (5) acts as another potential plate and forms an open capacitor with the at least one auxiliary potential plate (11), whose dielectric is formed by the substrate (2).

6. Wall detector according to claim 5, wherein the detection antenna (5) is connected to the permittivity measurement device (10) by a decoupling device (13).

7. Wall detector according to claim 1, wherein the permittivity measurement device (10) is formed as an oscillator within oscillating circuit or bridge arm, of which the auxiliary potential plate (11), with the substrate (2) as dielectric, forms a measurement capacitance (C).

8. Wall detector according to claim 1, wherein the permittivity measurement device (10) is formed as a switched charge transfer sensor in which the auxiliary potential plate (11), with the substrate as dielectric, forms the measured measurement capacitance (C).

9. Measurement method for detecting an object (3) embedded in a substrate (2), comprising a measurement step (23) that is carried out by a measurement system (6) for measuring a delayed interaction between the object (3) and the broadband, high-frequency alternating electric fields (9) of a mean measurement frequency ($f_M$) which are introduced in the substrate (2) by a detection antenna (5); a detection step (24) that is carried out by a calculation device (7) for detecting the object (3) based on a measurement signal and for determining an associated depth information; a permittivity measurement step (17) for measuring a permittivity measurement signal and that is carried out by a permittivity measurement device (10) beforehand with a permittivity measurement frequency ($f_p$) that is lower than the mean measurement frequency ($f_M$); and a permittivity determination step (18) in which a relative permittivity $\in_r$ of the substrate (2) is determined for the mean measurement frequency ($f_M$) by the calculation device (7) using a stored material model (14) described by a relaxation in the permittivity determination step (18).

10. Measurement method according to claim 9, wherein a water component ($S_w$) is determined in an extrapolation step (20) of the permittivity determination step (18) depending on a complex permittivity ($\in^*$) measured in the permittivity measurement step (17) with a given building material permittivity ($\in_m$) by using the material model (14) which takes into account a material mixture, and the complex permittivity ($\in^*$) of the substrate (2) at the mean measurement frequency ($f_M$) is extrapolated subsequently by the material model (14), with the water component ($S_w$) as fixed parameter.

11. Measurement method according to claim 9, wherein the permittivity measurement step (17) and the subsequent permittivity determination step (18) are repeated multiple times.

12. Measurement method according to claim 11, wherein a multiple repetition of the permittivity measurement step (17) and the subsequent permittivity determination step (18) is effected before every measurement step (23).

13. Measurement method for detecting an object (3) embedded in a substrate (2), comprising a measurement step (23) that is carried out by a measurement system (6) for measuring a delayed interaction between the object (3) and the broadband, high-frequency alternating electric fields (9) of a mean measurement frequency ($f_M$) which are introduced in the substrate (2) by a detection antenna (5); a detection step (24) that is carried out by a calculation device (7) for detecting the object (3) based on a measurement signal and for determining an associated depth information; a permittivity measurement step (17) for measuring a permittivity measurement signal and that is carried out by a permittivity measurement device beforehand with a permittivity measurement frequency ($f_p$) that is lower than the mean measurement frequency ($f_M$); and a permittivity determination step (18) in which a relative permittivity $\in_r$ of the substrate (2) is determined for the mean measurement frequency ($f_M$) by the calculation device (7) using a stored material model (14);

wherein the material model (14) is described by a relaxation in the permittivity determination step (18).

* * * * *